(12) United States Patent
Fujiki et al.

(10) Patent No.: US 8,467,241 B2
(45) Date of Patent: Jun. 18, 2013

(54) SEMICONDUCTOR MEMORY DEVICE

(75) Inventors: Jun Fujiki, Kanagawa-ken (JP);
Kiwamu Sakuma, Kanagawa-ken (JP);
Naoki Yasuda, Kanagawa-ken (JP);
Yukio Nakabayashi, Kanagawa-ken (JP);
Masumi Saitoh, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 13/246,996

(22) Filed: Sep. 28, 2011

(65) Prior Publication Data

US 2012/0075928 A1    Mar. 29, 2012

(30) Foreign Application Priority Data

Sep. 29, 2010    (JP) .................................. 2010-219988

(51) Int. Cl.
*G11C 11/34*    (2006.01)
(52) U.S. Cl.
USPC ...................................... 365/184; 365/189.02
(58) Field of Classification Search
USPC ........................................... 365/184, 189.02
See application file for complete search history.

(56) References Cited

U.S. PATENT DOCUMENTS

| 7,626,219 | B2 * | 12/2009 | Forbes ........................... 257/266 |
| 7,652,947 | B2 * | 1/2010 | Bernstein et al. ......... 365/230.06 |
| 7,742,327 | B2 * | 6/2010 | Chuang et al. ................. 365/154 |
| 2003/0006446 | A1 * | 1/2003 | Forbes et al. .................. 257/302 |

FOREIGN PATENT DOCUMENTS

| JP | 2001-167590 A | 6/2001 |
| JP | 2009-265912 A | 11/2009 |

OTHER PUBLICATIONS

Jin-Woo Han et al., "Polysilicon Channel TFT With Separated Double-Gate for Unified RAM (URAM)—Unified Function for Nonvolatile SONOS Flash and High-Speed Capacitorless 1T-DRAM," IEEE Transactions on Electron Devices, vol. 57, No. 3, Mar. 2010, pp. 601-607.
Background Art Information Sheet provided by applicants (Jan. 7, 2011) (1 page total).

* cited by examiner

*Primary Examiner* — Michael Tran
(74) *Attorney, Agent, or Firm* — Posz Law Group, PLC

(57) ABSTRACT

In a semiconductor layer, information is written by applying a first potential to a first electrode, applying a second potential that is lower than the first potential to all of back gate electrodes, applying a third potential that is higher than the first potential to the first to $(i-1)^{th}$ front gate electrodes, and applying a fourth potential that is between the second and third potentials to the $i^{th}$ and subsequent front gate electrodes, where "i" is a positive integer and identifies a specific location to which information is to be written.

10 Claims, 10 Drawing Sheets

SEMICONDUCTOR MEMORY DEVICE

CROSS REFERENCE TO RELATED APPLICATION

The present application is related to, claims priority from and incorporates by reference Japanese Patent Application No. 2010-219988, filed on Sep. 29, 2010.

FIELD

Embodiments of the present application generally relate to a semiconductor memory device.

BACKGROUND

Flash memories are assembled in solid state drives (SSDs) and provide fast and large-capacity storage that replaces hard disk drives (HDDs). In an SSD, a controller chip, a cache memory chip (e.g., dynamic random access memory, or DRAM) and multiple flash memory chips are built. The number of times that each memory element in a flash memory can be rewritten is limited. To maintain data retention capability, the controller chip performs operations, such as wear leveling and write caching.

To operate these reliability maintenance systems mentioned above, it is necessary for the SSD to include a large-capacity cache memory. Meanwhile, the cache memory built in the SSD and the DRAM used for calculation by the processor are redundant. Therefore, an embedded type SSD has been proposed in which the DRAM for the processor acts as the cache memory for the SSD. However, there is a drawback that, when a cache operation is performed on a large amount of information to be recorded, the processing speed of the processor is reduced. Accordingly, development is desired of a so-called unified memory that is capable of operating as a volatile memory even though the memory is physically a non-volatile large capacity memory.

DETAILED DESCRIPTION OF EMBODIMENTS

Figure 1:
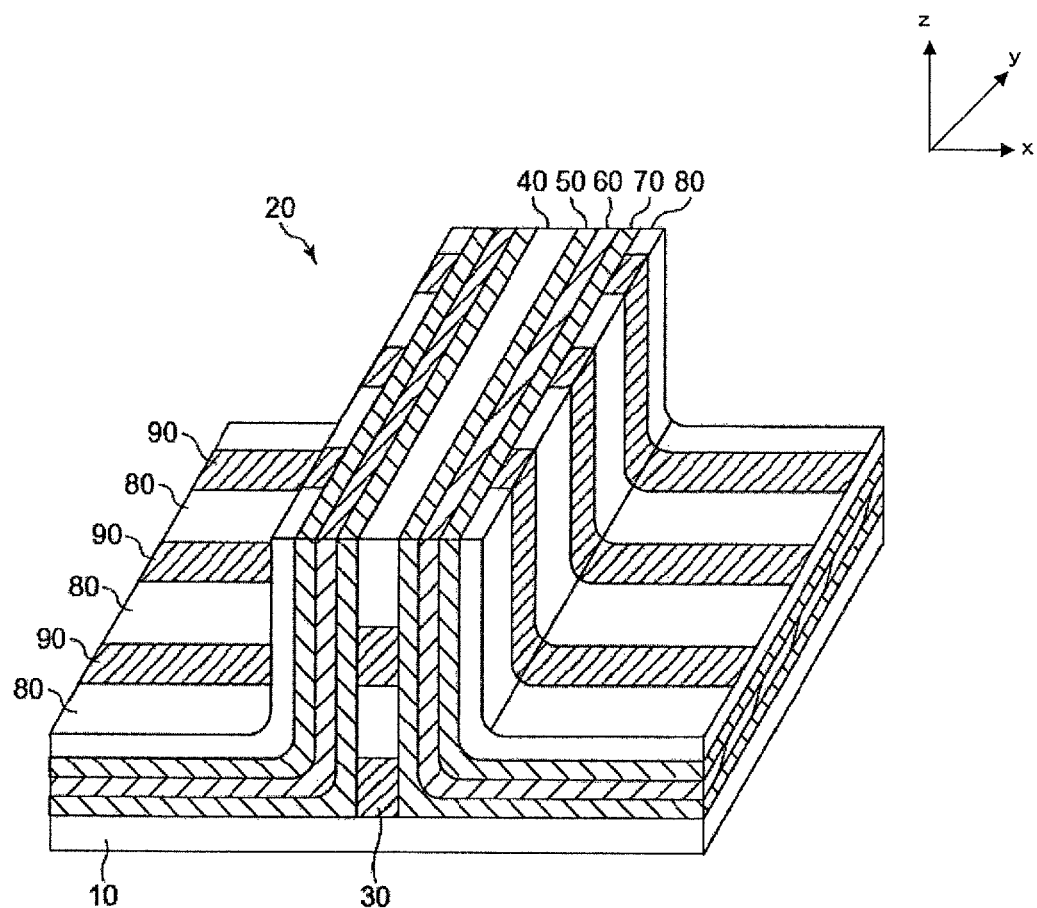
FIG. 1 illustrates a semiconductor memory device according to a first embodiment.

Each embodiment of the present application is described below with reference to the drawings. Parts with the same reference numerals indicate similar parts. In addition, the drawings are schematic or conceptual. Therefore, relationships between a thickness and a width of each part, relative factors in size between parts and the like are not necessarily the same as an actual device. Moreover, even if the same parts are indicated, the size and relative factors in size may vary depending on the figure. Voltages may be expressed by potential differences or simply potentials.

First Embodiment

FIG. 1 is a schematic diagram illustrating a semiconductor memory device 20. Wiring and the like are omitted.

The semiconductor memory device 20 is provided on a semiconductor substrate 10. A multilayer body (or stack) is provided on the semiconductor substrate 10. In the multilayer body, insulation films 30 and semiconductor layers 40 that extend in the y-axis direction (first direction) are alternately layered. Tunnel insulation films 50, charge accumulation films 60, block insulation films 70 and gate electrodes 80 are provided in a manner of sandwiching the multilayer body on the semiconductor substrate 10 in the x-axis direction (second direction) that is orthogonal to the y-axis direction.

The gate electrodes 80 are insulated by multiple insulation films 90 in the y-axis direction. The z-axis direction indicates a direction perpendicular to a top surface of the semiconductor substrate 10. The z-axis direction is orthogonal to the x-axis and y-axis directions.

Figure 2:
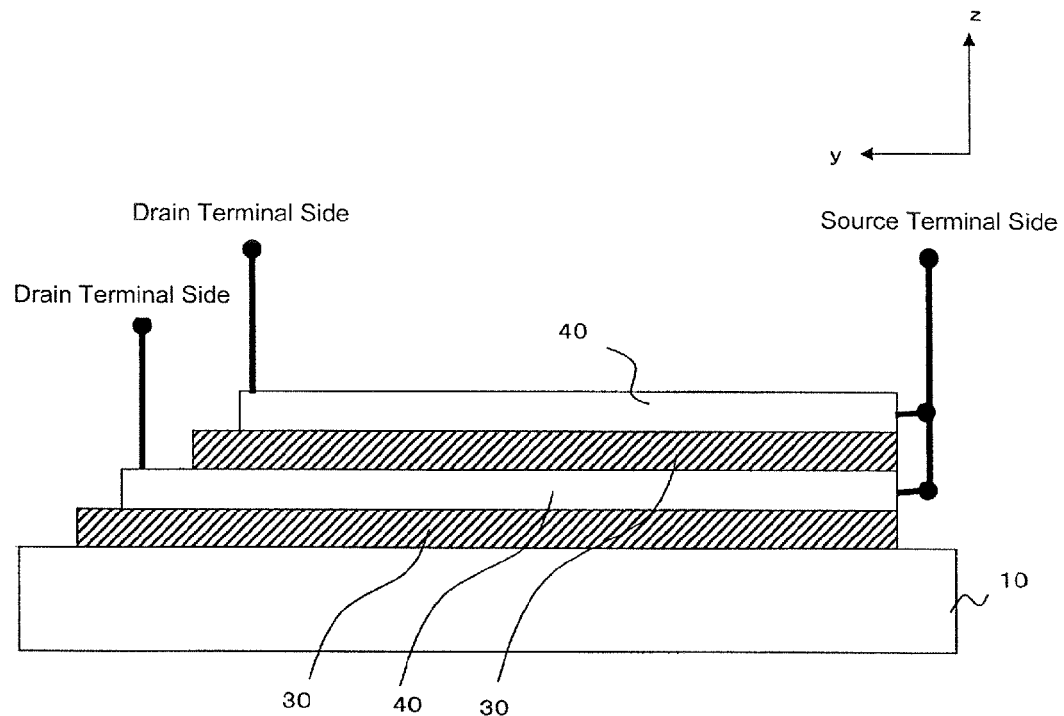
FIG. 2 is a cross-sectional view of the semiconductor memory device.

FIG. 2 is a view of the multilayer body from the x-axis direction, in which the insulation films 30 and the semiconductor layers 40 are alternately layered on the semiconductor substrate 10. As shown in FIG. 2, an end of the multilayer body is formed in a step pattern in the y-axis direction. In the step pattern, a lower layer is longer than an upper layer. Electrical connections are made at respective portions of the semiconductor layers 40 that protrude from the adjacent upper semiconductor layers 40. In FIG. 2, these portions are shown as drain terminal sides. The other end of the multilayer body is flush. The end is shown as source terminal sides. That is, one end of the multilayer body is used for drain terminals, and the other end of the multilayer body is used for source terminals. On the source terminal side, the voltages of all of the semiconductor layers 40 that configure the multilayer body are constant. On the drain terminal side, each of the voltages of the semiconductor layers 40 that configure the multilayer body is individually controlled.

Figure 3:
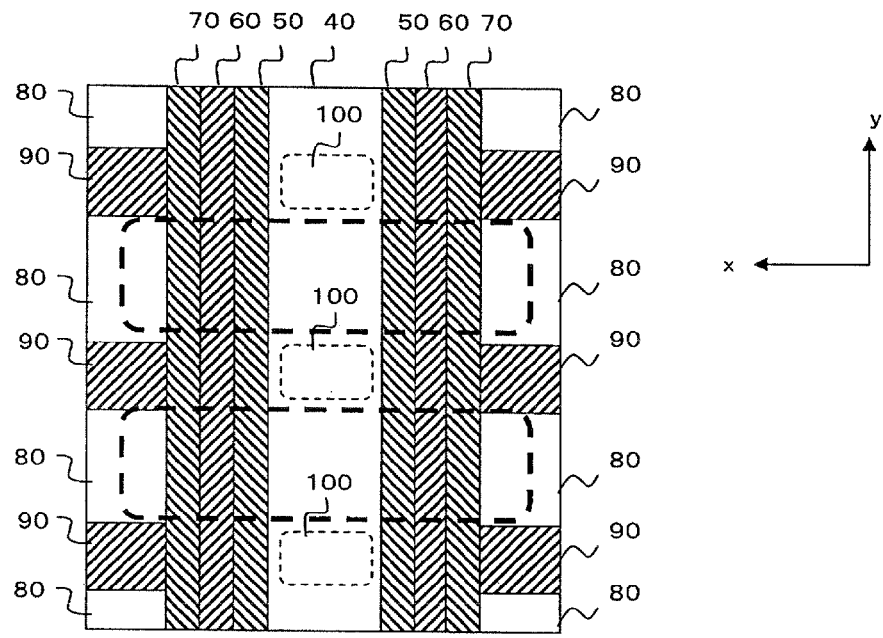
FIG. 3 is a top view of the semiconductor memory device.

FIG. 3 is a view of the semiconductor memory device 20 in a direction perpendicular to the top surface of the semiconductor substrate 10. As shown in FIG. 3, multiple diffusion regions 100 are provided separately in the semiconductor layers 40 that extend in the y-axis direction. The insulation films 90 on the right side of FIG. 3 are called front gate insulation films, and the insulation films 90 on the left side of FIG. 3 are called back gate insulation films. The diffusion regions 100 exist between the front gate insulation films and the back gate insulation films. The semiconductor layers 40 that extend in the y-axis direction are sandwiched by the tunnel insulation films 50, the charge accumulation films 60, the block insulation films 70, and the gate electrodes 80 that are provided in the x-axis direction. The insulation films 90 are provided between the gate electrodes 80 in a manner of sandwiching the diffusion regions 100 in the x-axis direction. The insulation films 90 insulate the gate electrodes 80 in the y-axis direction. The y-axis direction corresponds to a NAND array direction. A memory cell refers to a configuration in which the semiconductor layers 40 are sandwiched by the tunnel insulation films 50, the charge accumulation films 60, the block insulation films 70 and the gate electrodes 80. In FIG. 3, regions surrounded by dotted lines correspond to memory cells. Further, the configuration in which the semiconductor layers 40 are sandwiched by the tunnel insulation films 50, the charge accumulation films 60 and the block insulation films 70 is called a memory region. As needed, a select gate may be provided (on both ends of the NAND array).

Figure 4:
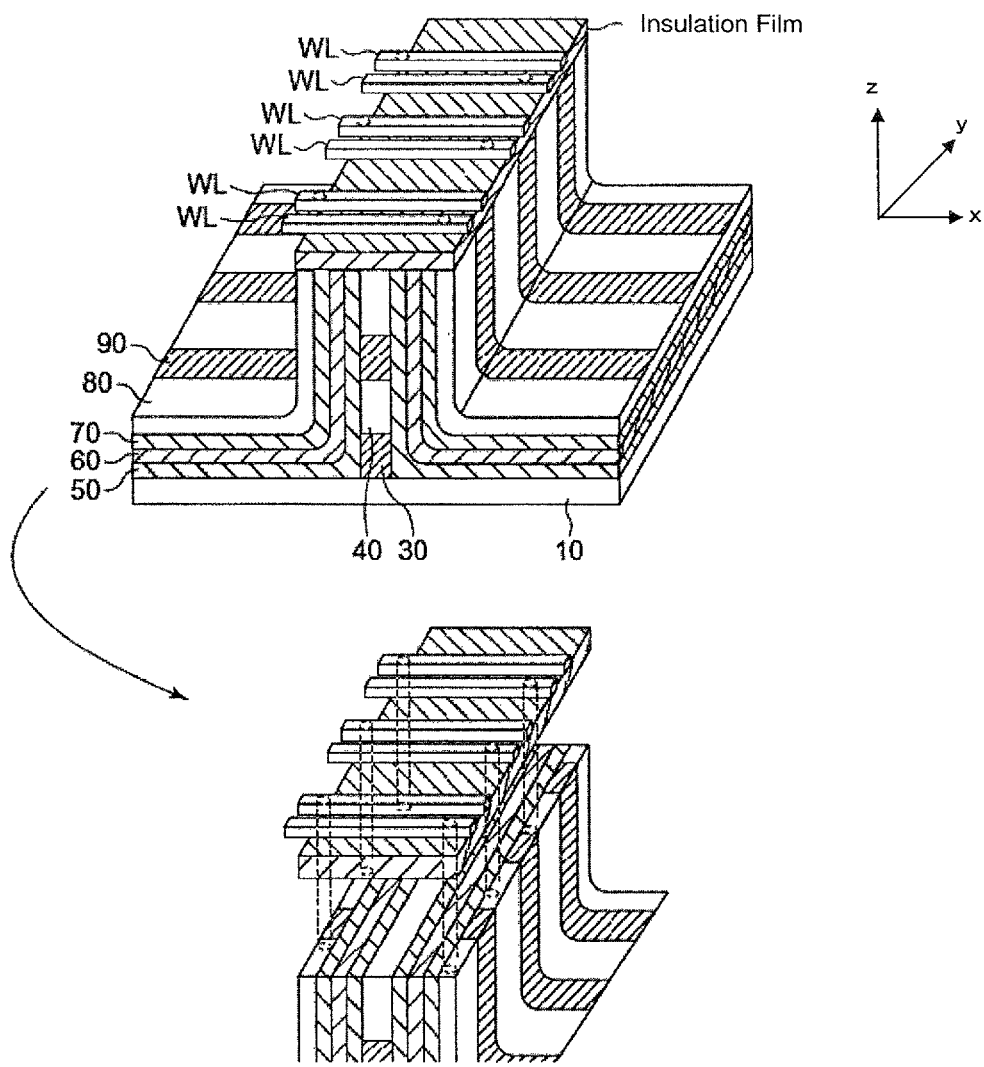
FIG. 4 is an illustration explaining a configuration of wiring in the semiconductor memory device.

FIG. 4 is an illustration explaining a wiring configuration of the gate electrodes 80 shown in FIG. 3.

First, an insulation film is provided on a fin-shaped protrusion of the semiconductor memory device 20. Holes are made through the insulation film at positions corresponding to the gate electrodes 80. Word lines WL are provided in the y-axis direction as shown in FIG. 4 by connecting to the electrodes though the holes.

Figure 5A:
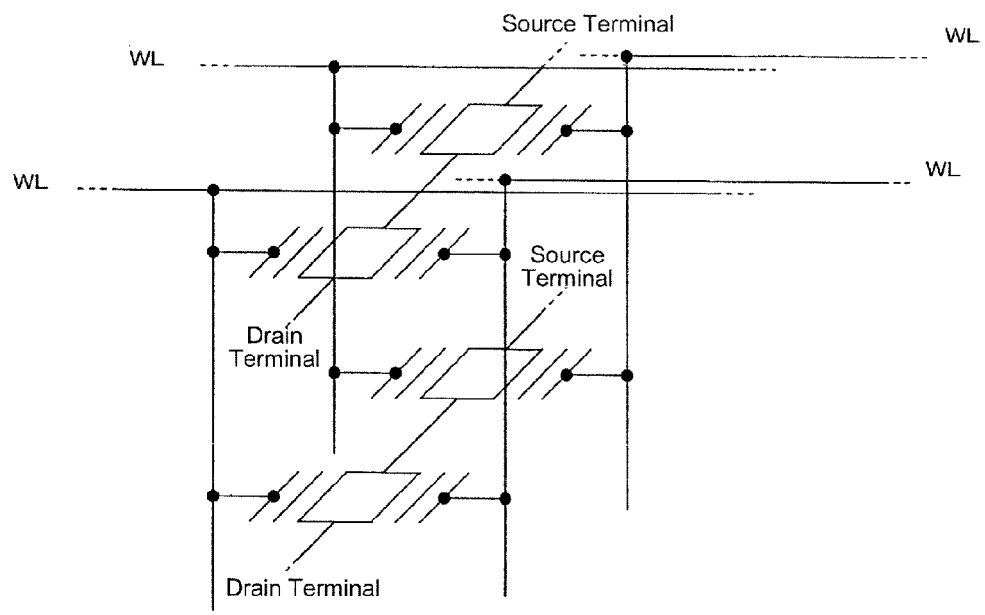
FIGS. 5A and 5B illustrate equivalence circuits of the semiconductor memory device.
Figure 5B:
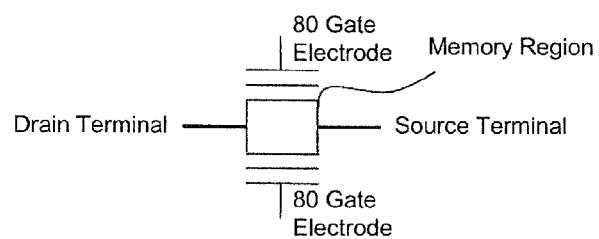

This state is illustrated by an equivalence circuit schematic shown in FIG. 5A. As shown in FIG. 5A, the memory regions are connected in series between a source terminal and a drain terminal. Each memory region is connected by two gate electrodes 80 in a direction orthogonal to the direction in which the source terminal and the drain terminal are connected (up-down direction). FIG. 5B is an illustration explaining a configuration of a memory cell.

For the semiconductor substrate 10, a Si substrate, a SiGe substrate, an SOI substrate or the like may be used.

For the insulation films 30, silicon nitride (SiN), silicon oxide ($SiO_2$), aluminum oxide ($Al_2O_3$), or the like, for example, may be used. The film thickness of the insulation films 30 is, for example, equal to or greater than 10 nm and equal to or less than 70 nm.

For the semiconductor layers 40, Si, polysilicon, SiGe, Ge or the like, for example, may be used. In the present embodiment, the semiconductor layers 40 are assumed to be p-type semiconductor layers. The film thickness of the semiconductor layers 40 is, for example, equal to or greater than 5 nm and equal to or less than 60 nm.

For the tunnel insulation films 50, silicon oxide ($SiO_2$), aluminum oxide ($Al_3O_2$) or the like, for example, may be used. The film thickness of the tunnel insulation films 50 is, for example, equal to or greater than 1 nm and equal to or less than 10 nm.

For the charge accumulation films 60, silicon nitride (SiN), for example, may be used. The film thickness of the charge accumulation films 60 is, for example, equal to or greater than 1 nm and equal to or less than 10 nm.

For the block insulation films 70, silicon oxide ($SiO_2$), aluminum oxide ($Al_3O_2$) or the like, for example, may be used. The film thickness of the tunnel insulation films 70 is, for example, equal to or greater than 1 nm and equal to or less than 10 nm.

Each of the tunnel insulation films 50, the charge accumulation films 60 and the block insulation films 70 may include a multilayer configuration. For example, a multilayer film formed of a silicon nitride film (SiN) and a silicon oxide film ($SiO_2$) may be layered, or a multilayer film formed of a silicon oxide film ($SiO_2$) and an aluminum oxide film ($Al_2O_3$) may be used.

For the gate electrodes 80, a semiconductor material or a metal material, for example, may be used. As the semiconductor material, polysilicon, SiGe, Ge or the like may be used. As the metal material, TaN, TiN, TiAlN, TaAlN, MN or the like may be used.

For the insulation films 90, silicon oxide ($SiO_2$), aluminum oxide ($Al_2O_3$) or the like, for example, may be used.

The diffusion regions 100 may be of a conductive type different from the semiconductor layer 40. In the present embodiment, the diffusion regions 100 are n-type semiconductors.

Next, a principle of operation of the semiconductor memory device 20 is described. The semiconductor memory device 20 achieves operations of writing, erasing and the like of volatile data (or data stored in volatile state) and non-volatile data (or data stored in non-volatile state) using arbitrary memory cells.

The explanation below assumes that the operation is performed using a semiconductor layer 40 that is the uppermost layer among the multilayer body that configures the semiconductor memory device 20. In order to select the uppermost semiconductor layer 40, a voltage needs to be applied to the desired semiconductor layer 40.

The writing and erasing operations of non-volatile data are explained.

(Writing and Erasing Operations)

Figure 6:
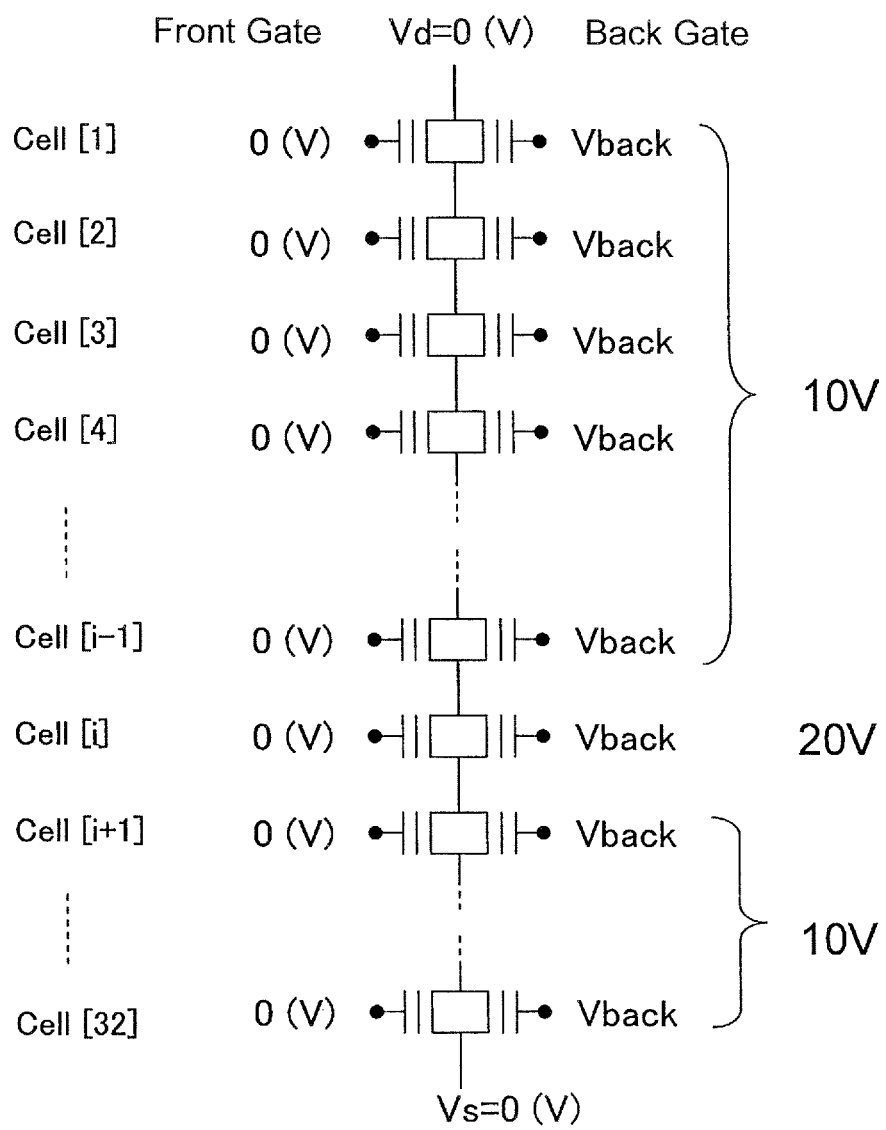
FIG. 6 is an illustration explaining an operation of the semiconductor memory device.

FIG. 6 is an illustration explaining the writing operation in the NAND array of the semiconductor memory device 20. The explanation is made with an assumption that thirty two memory cells are connected in series. The number of memory cells connected is not limited to thirty two. The total number of memory cells can be represented with an integer "n." The gate electrodes 80 on the left side of FIG. 6 are referred to as front gates (also called front gate electrodes), and the gate electrodes 80 on the right side are referred to as back gates (also called back gate electrodes). A terminal connected to the first memory cell (Cell [1]) is a drain terminal, and a terminal connected to the $32^{nd}$ memory cell (Cell [32]) is a source terminal. A voltage is not applied to the drain and source terminals (Vd=0 V, Vs=0 V) (first non-volatile state potential).

Data is to be written in the $i^{th}$ memory cell (Cell [i]) (i is a positive integer). The integer "i" identifies a specific memory cell that is a target in which data is to be written.

First, a positive voltage (Vback) is applied to the back gates of all memory cells. The value of voltage Vback is 10 V (second non-volatile state potential), for example. At this time, the voltage of the drain and source terminals is 0 V.

Next, a further voltage is applied to the back gate of the memory cell Cell [i]. At this time, the voltage value of Vback is 20 V (third non-volatile state potential), for example. This is because a tunnel electric field generally needs to be approximately at 15 MV/cm.

By doing so, electricity is conducted through channels of Cell [1]-Cell [i], and a channel potential is fixed. Therefore, electrons in the semiconductor layer 40 are accumulated in the charge accumulation film 50 on the back gate side, allowing the writing of data in the Cell [i]. That is, information is written in the charge accumulation film 50. When the voltage is applied to the front gate instead of the back gate, the electrons are accumulated in the charge accumulation film 50 on the front gate side, allowing the writing of data in the memory cell.

When the operation for erasing the data in the memory cells is performed, the data written in the NAND array is all erased by applying a positive voltage to the source and drain terminals while applying no voltage (0 V) to the back gate and front gate of all memory cells.

The writing and erasing operations of volatile data are explained.

(Writing Operation)

Figure 7:
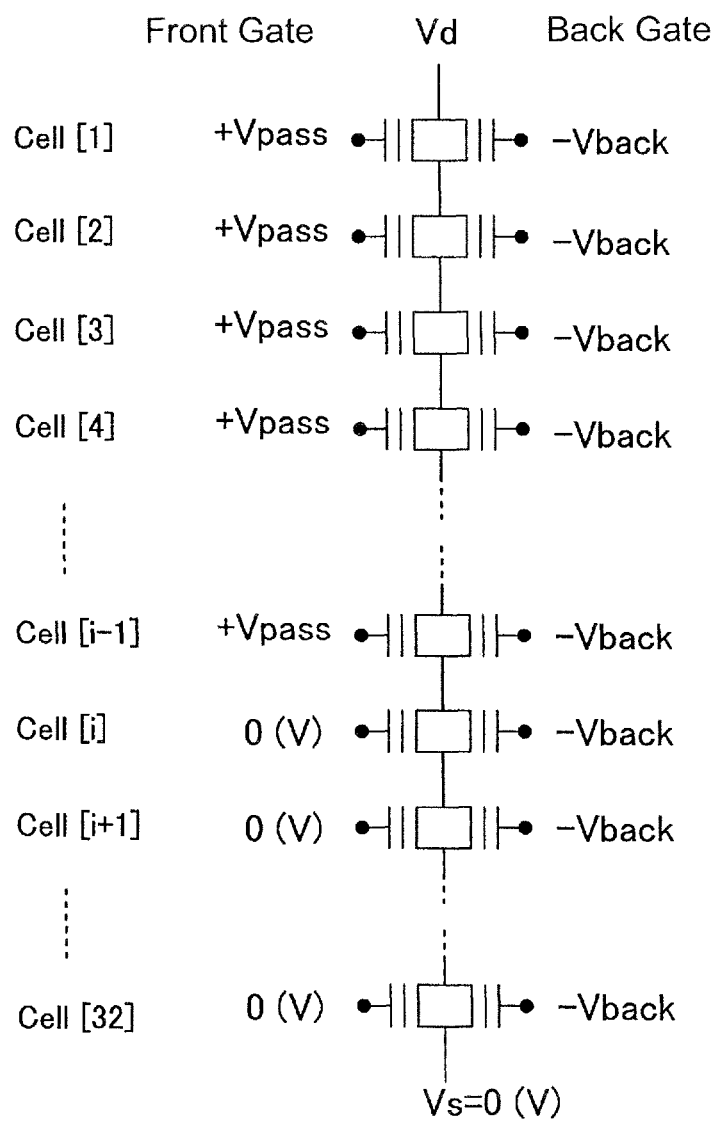
FIG. 7 is an illustration explaining an operation of the semiconductor memory device.

FIG. 7 is an illustration explaining the writing operation in the NAND array of the semiconductor memory device 20. The explanation is made with an assumption that thirty two memory cells are connected in series. The number of memory cells connected is not limited to thirty two. The total number of memory cells can be represented with an integer "n." The gate electrodes 80 on the left side of FIG. 7 are referred to as front gates, and the gate electrodes 80 on the right side are referred to as back gates. A terminal connected to the first memory cell (Cell [1]) is a drain terminal, and a terminal connected to the $32^{nd}$ memory cell (Cell [32]) is a source terminal. A positive voltage (Vd) (first potential) is applied to the drain terminal, and no voltage (Vs=0 V) is applied to the source terminal. A value of the voltage Vd is equal to or greater than 0.1 V and equal to or less than 10 V.

Data is to be written in the $i^{th}$ memory cell (Cell [i]) (i is a positive integer).

First, a negative voltage (−Vback) (second potential) is applied to the back gates of all memory cells belonging to the NAND array. The voltage value of Vback is equal to or greater than 0.1 V and equal to or less than 10 V.

Next, a positive voltage (Vpass) (third potential) is applied to the front gates of the memory cells Cell [1] to Cell [i−1]. The voltage value of Vpass is equal to or greater than 0.1 V and equal to or less than 10 V. At this time, no voltage (fourth potential) is applied to the memory cell Cell [i] to the memory cell Cell [32].

By applying Vpass to the memory cells Cell [1] to Cell [i−1], an inversion layer channel is formed on the front gate side of the semiconductor layer 40, and a potential of the diffusion regions 100 adjacent to the memory cell Cell [i] becomes equal to the voltage Vd applied to the drain terminal.

At this time, an electron-hole pair is generated due to impact ionization near a border of the diffusion region 100 between the memory cells Cell [i−1] and Cell [i] and the semiconductor layer 40 of the memory cell Cell [i]. The impact ionization is a phenomenon in which the electron-hole pair is generated when electrons accelerated by an electric field impact a crystal grating.

Electrons generated near the border are discharged to the drain terminal side through the inversion layer formed from the memory cell Cell [1] to the memory cell Cell [i−1]. Meanwhile, the holes generated near the border are pulled to and held at the back gate side of the semiconductor layer 40 of the memory cell Cell [i]. This is because the negative potential (−Vback) is applied to the entire back gate.

The writing is performed by holding the holes in the semiconductor layer 40. That is, information is written in the semiconductor layer 40.

(Erasing Operation)

The information can be erased by losing the holes held in the semiconductor layers 40. That is, 0 V or a positive voltage (fifth potential) is applied to the back gate. At this time, the voltage at the source and drain terminals is set to 0 V. The holes disappear as the holes are re-coupled with the inversion layer charge (electrons) supplied from the source and drain terminals.

(Reading Operation)

Figure 8:
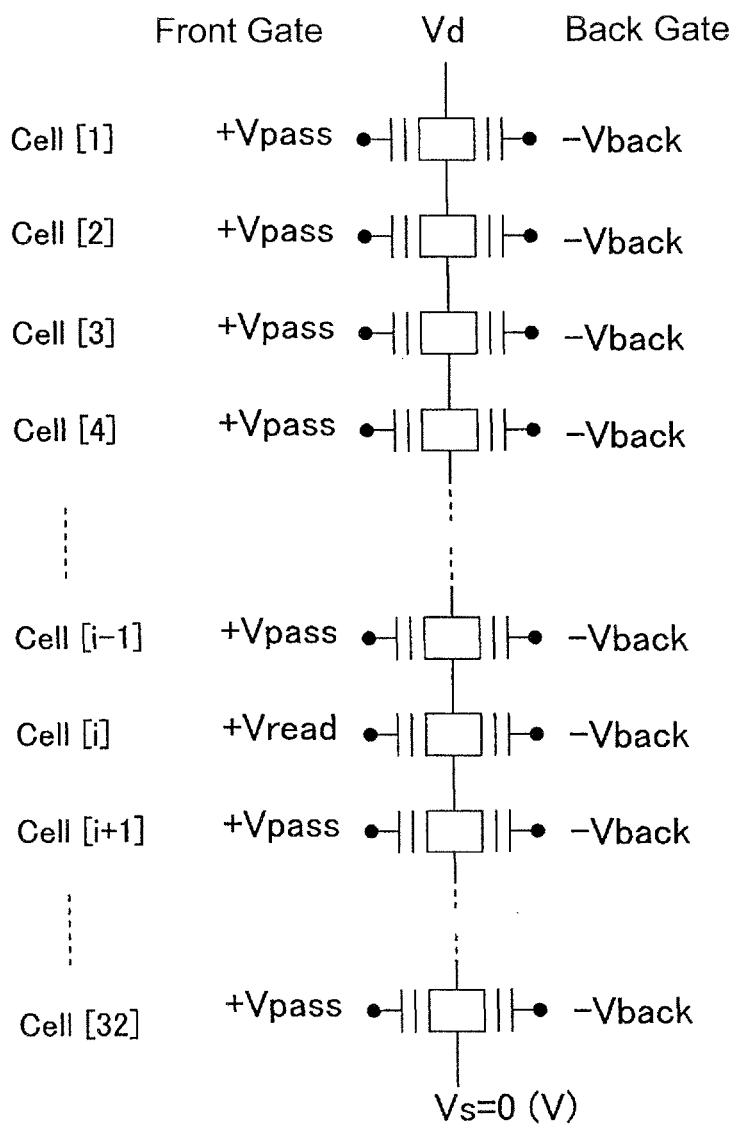
FIG. 8 is an illustration explaining an operation of the semiconductor memory device.

FIG. 8 is an illustration explaining the reading operation in the NAND array of the semiconductor memory device 20. Structures similar to the configuration explained in FIG. 7 are omitted.

It is assumed that the data in the $i^{th}$ memory cell (Cell [i]) is to be read out.

First, a negative voltage (−Vback) is applied to the back gates of all memory cells belonging to the NAND array. The voltage value of Vback is equal to or greater than 0.1 V and equal to or less than 10 V.

Next, a positive voltage (Vpass) is applied to the front gates of all of the memory cells except the memory cell Cell [i]. The voltage value of Vpass is equal to or greater than 0.1 V and equal to or less than 10 V.

By applying Vpass to all of the memory cells except the memory cell Cell [i], an inversion layer channel is formed on the front gate side of the semiconductor layer 40.

Then, a controller (not shown) connected to the semiconductor memory device 20 determines whether or not current flows when a reading voltage (Vread) (sixth potential) is applied to the front gate of the memory cell Cell [i]. At this time, a threshold varies corresponding to the existence of holes in the semiconductor layer 40. The voltage value of Vread is equal to or greater than 0.1 V and equal to or less than 10 V. The voltage of Vread is lower than the voltage of Vpass.

By doing so, the reading of the semiconductor memory device 20 is performed.

(Data Holding Operation)

Next, the operation to hold the data in a memory cell after writing the data is explained. This operation is called a refresh operation. The holes held in the semiconductor layer 40 gradually disappear after a certain amount of time elapses.

Figure 9:
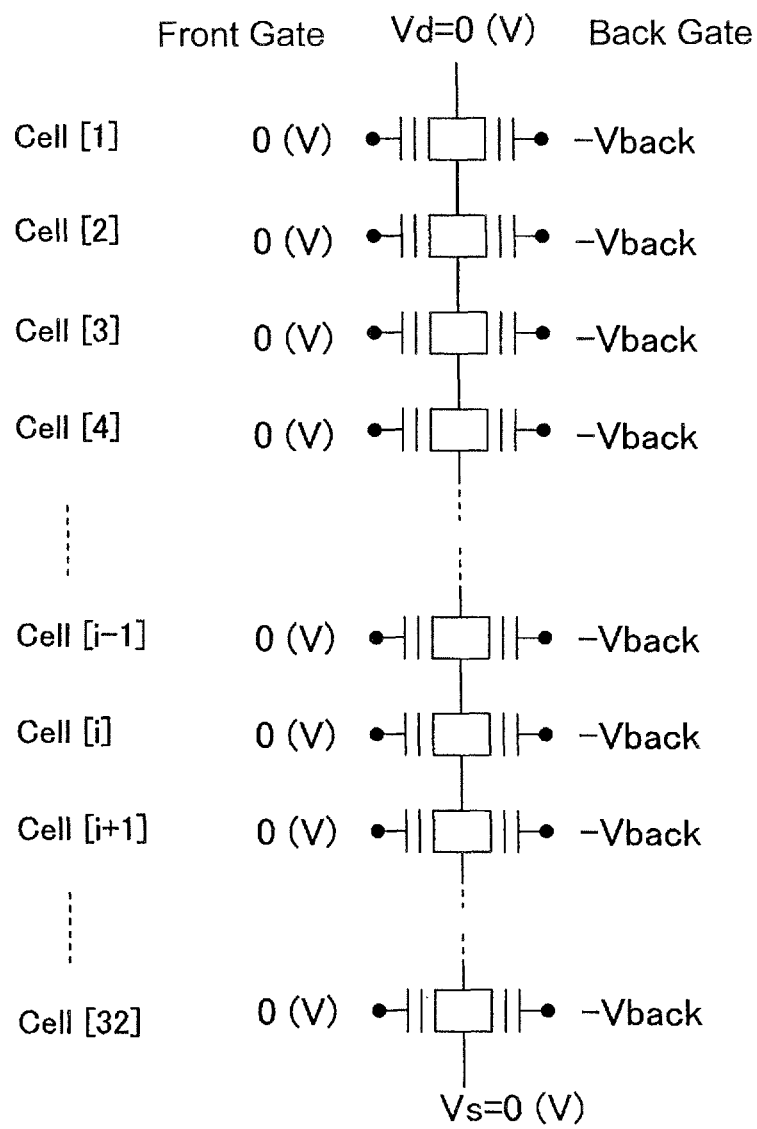
FIG. 9 is an illustration explaining an operation of the semiconductor memory device.

FIG. 9 is an illustration explaining the operation for holding data in the NAND array of the semiconductor memory device 20. Structures similar to the configuration explained in FIG. 7 are omitted.

Holding data in the $i^{th}$ memory cell (Cell [i]) is considered.

First, by applying a negative voltage (−Vback) to the back gate of all of the memory cells, the holes held in the semiconductor layer 40 are held. The voltage value of Vback is equal to or greater than 0.1 V and equal to or less than 10 V. At this time, the voltage of the front gate of all of the memory cells is 0 V. The voltage of the drain and source terminals is 0 V.

Next, the writing operation explained in conjunction with FIG. 7 is periodically performed after completing the reading operation explained with FIG. 6.

(Initialization Operation)

Figure 10:
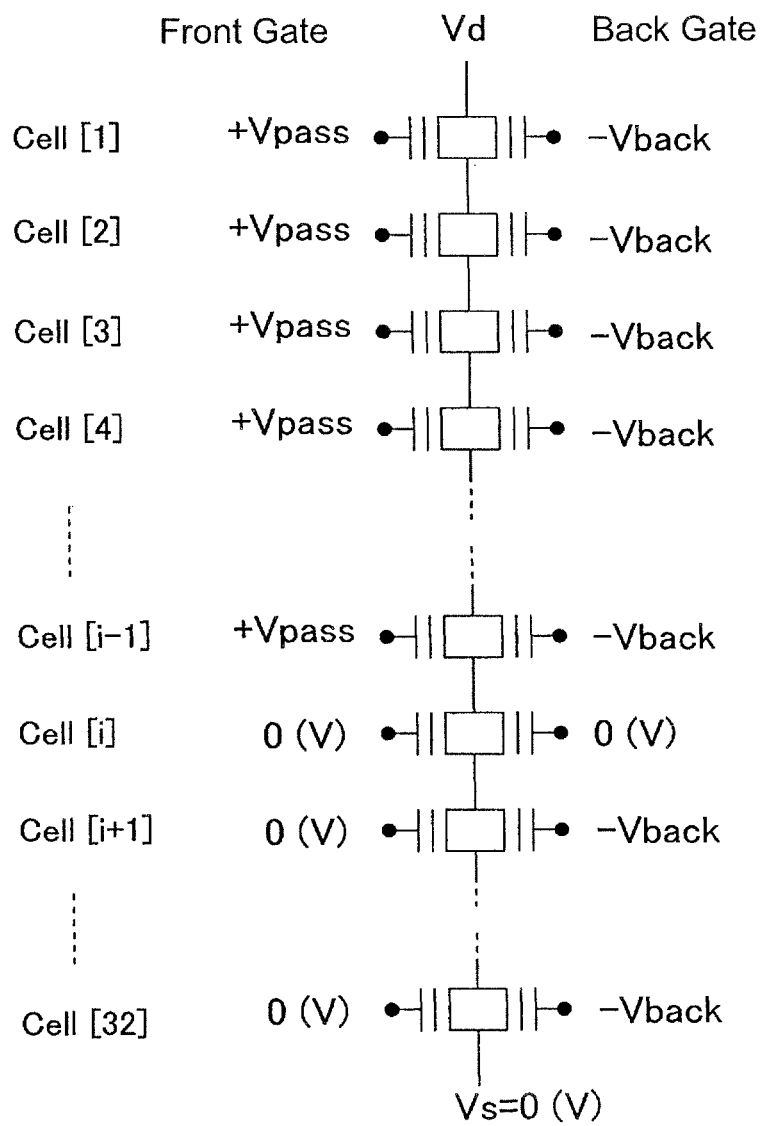
FIG. 10 is an illustration explaining an operation of the semiconductor memory device.

FIG. 10 is an illustration explaining an operation for initializing data in the NAND array of the semiconductor memory device 20. Structures similar to the configuration explained in FIG. 7 are omitted.

Initialization of the $i^{th}$ memory cell (Cell [i]) is considered. In addition, it is assumed that the non-volatile data is stored in the $i^{th}$ memory cell (Cell [i]). That is, electrons are accumulated in the charge accumulation films 60 on the back gate side. At this time, the back gate side of the semiconductor layer 40 is under a negative electric field. In other words, the back gate side is considered as being negatively charged. A positive voltage (Vd) is applied to the drain terminal. The voltage value of Vd is equal to or greater than 0.1 V and equal to or less than 10 V.

First, a negative voltage (−Vback) is applied to the back gate of the all memory cells except the memory cell Cell [i]. This is to hold volatile data in the other cells even during initialization.

Next, by applying a positive voltage (Vpass) to the front gate of the memory cell Cell [1] to the memory cell Cell [i−1], an inverse layer channel is formed on the front gate side of the semiconductor layer 40. At this time, the potential of the diffusion regions 100 between the memory cell Cell [i] and the memory cell [i−1] becomes equivalent to the voltage Vd of the drain terminal.

As a result, impact ionization occurs near the border of the diffusion region 100, which is provided between the memory cell Cell [i−1] and the memory cell Cell [i], and the semiconductor layer 40 at the memory cell Cell [i]. Thereby, the electron-hole pair is generated.

The electrons generated near the border are discharged to the drain terminal side through the inversion layer channel.

Meanwhile, the holes generated near the border are injected to the charge accumulation film 60 on the back gate side of the memory cell Cell [i]. Therefore, the electrons in the charge accumulation film 60 disappear. If the electrons have not been accumulated in the charge accumulation film 60, because the back gate side of the semiconductor layer 40 is not under a negative electric field, the impact ionization does not occur. Therefore, data is not written in the semiconductor layer 40.

According to the semiconductor memory device 20, information necessary to perform the write caching operation is processed inside the semiconductor memory device. Therefore, the size of the semiconductor memory device is reduced. Moreover, the semiconductor memory device 20 can be switched between a volatile type and a non-volatile type. As such, the reliability of the flash memory can be maintained without decreasing the processing speed of the processor. The back gate and the front gate of the memory cell Cell [1] may be a select gate.

EXEMPLARY MODIFICATION

Figure 11:
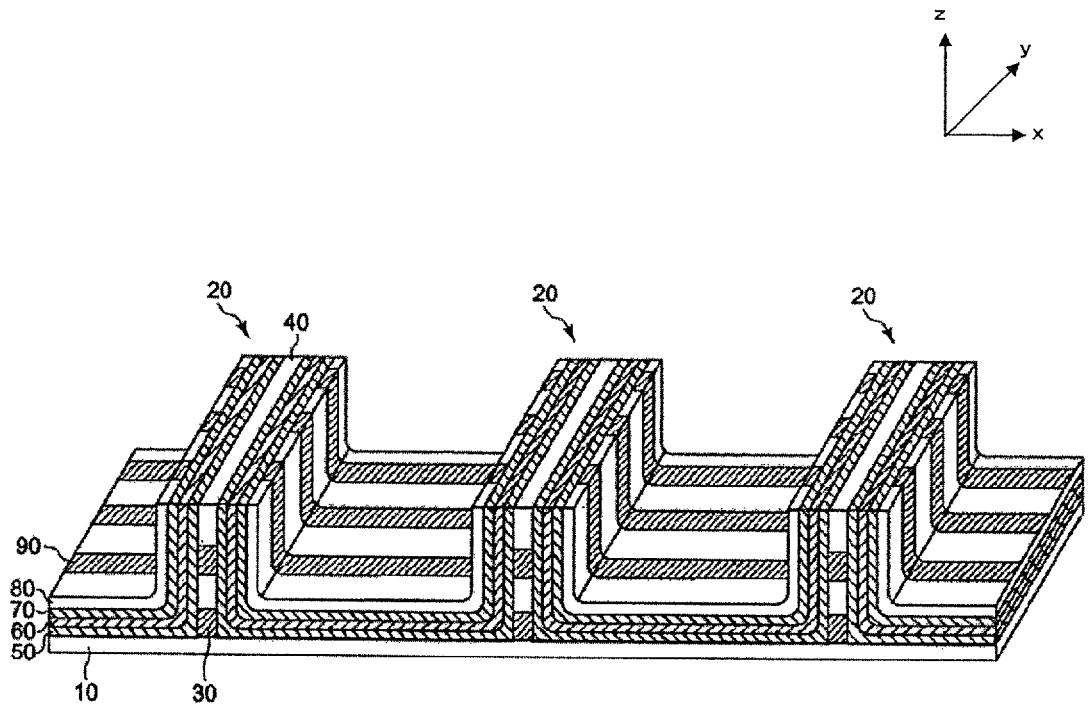
FIG. 11 illustrates an exemplary modification of the semiconductor memory device.

FIG. 11 illustrates an exemplary modification of the semiconductor memory device 20. Multiple semiconductor memory devices 20 may be arranged as shown in FIG. 11. The semiconductor devices 20 are insulated from each other in the x-axis direction.

Figure 12:
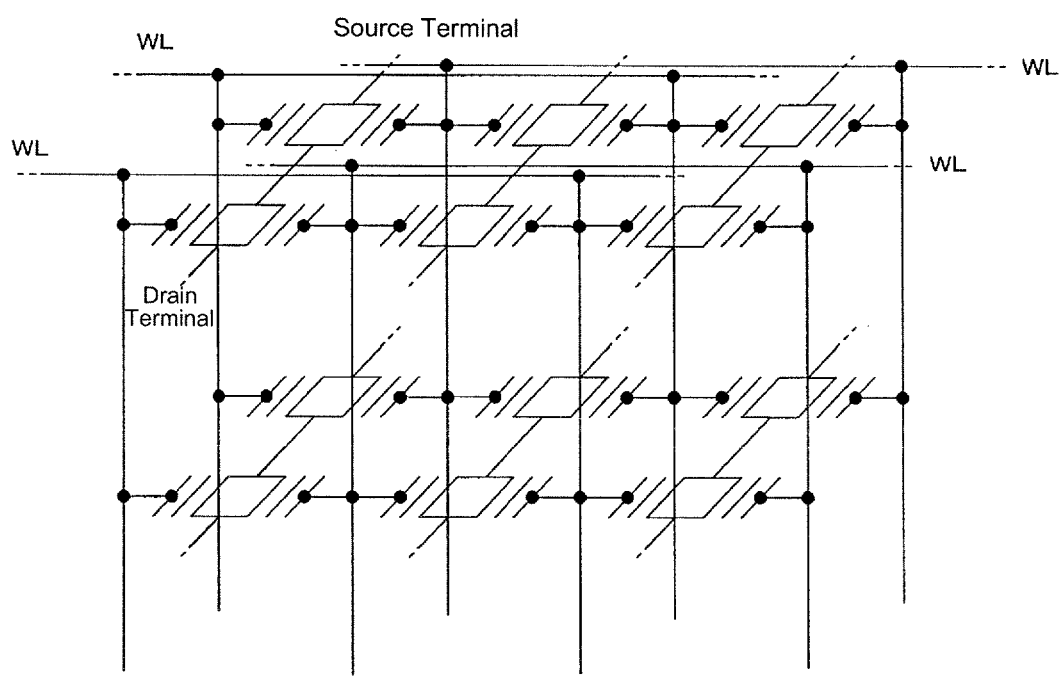
FIG. 12 illustrates an equivalence circuit of the semiconductor memory device.

FIG. 12 illustrates an equivalent circuit diagram of the semiconductor memory devices 20 shown in FIG. 11. That is, as shown in FIG. 12, multiple NAND arrays, in each of which multiple memory cells are connected in series, are connected in parallel in the x-axis direction. When data is written, appropriate voltages are applied to the source terminal, drain terminal, and front or back gate terminals that correspond to the memory cell to which the data is to be written.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and the spirit of the inventions.

What is claimed is:

1. A semiconductor memory device, comprising:
a semiconductor layer that extends in a first direction;
first and second electrodes that are provided, in the first direction, on one end and the other end of the semiconductor layer;
first and second block insulation films that sandwich the semiconductor layer and that are provided in a second direction orthogonal to the first direction;
a first charge accumulation film that is provided between the first block insulation film and the semiconductor layer;
a second charge accumulation film that is provided between the second block insulation film and the semiconductor layer;
a first tunnel insulation film that is provided between the first charge accumulation film and the semiconductor layer;
a second tunnel insulation film that is provided between the second charge accumulation film and the semiconductor layer;
n front gate electrodes that are provided in the first direction as insulated from each other and that are provided at an opposite side from the side where the first charge accumulation film of the first block insulation film is disposed, where "n" is a positive integer equal to or greater than two;
n back gate electrodes that are provided in the first direction as insulated from each other and that are provided at an opposite side from the side where the second charge accumulation film of the second block insulation film is disposed;
front gate insulation films that insulate the n front gate electrodes;
back gate insulation films that insulate the n back gate electrodes; and
a plurality of diffusion regions provided between the first and second electrodes and between the front gate insulation films and the back gate insulation films, the plurality of diffusion regions being separated from each other within the semiconductor layer, wherein
information is written in the semiconductor layer by applying a first potential to the first electrode, applying a second potential that is lower than the first potential to all of the back gate electrodes, applying a third potential that is higher than the first potential to the first to $(i-1)^{th}$ front gate electrodes, and applying a fourth potential that is between the second and third potentials to the $i^{th}$ and subsequent front gate electrodes, where "i" is a positive integer and identifies a specific location to which information is to be written.

2. The semiconductor memory device of claim 1, wherein the information written in the semiconductor layer is erased by applying the first potential to the first electrode and by applying a fifth potential that is equal to or higher than the first potential to all of the back gate electrodes.

3. The semiconductor memory device of claim 1, wherein in a condition where the information is written in the second charge accumulation film, the information is erased by applying the first potential to the first electrode, applying the second potential to the first to $(i-1)^{th}$ back gate electrodes, and by applying the third potential to the first to $(i-1)^{th}$ front gate electrodes.

4. The semiconductor memory device of claim 1, wherein the information written in the semiconductor layer is held by applying the second potential to the n back gate electrodes.

5. The semiconductor memory device of claim 1, wherein the information written in the semiconductor layer is read out by applying the second potential to all of the back gate electrodes, applying the third potential to all of the front gate electrodes except the $i^{th}$ front gate electrode, and applying a sixth potential that is between the first and third potentials to the $i^{th}$ front gate electrode.

6. The semiconductor memory device of claim 1, wherein the diffusion regions are of a conductive type different from the semiconductor layer.

7. The semiconductor memory device of claim 1, wherein a potential that is lower than the potential applied to the first electrode is applied to the second electrode.

8. A semiconductor memory device that stores information in volatile and non-volatile states, comprising:
a semiconductor layer:
first and second electrodes provided on respective ends of the semiconductor layer;

a set of n memory cells included in the semiconductor layer and being connected in series between first and second electrodes, where n is a positive integer equal to or greater than two;

front and back gate electrodes provided respectively on sides of each of the n memory cells, wherein the information is written in an $i^{th}$ memory cell in the volatile state by applying a first potential to the first electrode, applying a second potential that is lower than the first potential to each back gate electrode, applying a third potential that is higher than the first potential to each front gate electrode of the first to $(i-1)^{th}$ memory cells, and applying a fourth potential that is between the second and third potentials to each front gate electrode of the $i^{th}$ and subsequent memory cells, where the "i" is a positive integer, and identifies a specific memory cell on which the information is written, and the information is written in the $i^{th}$ memory cell in the non-volatile state by applying a first non-volatile state potential to the first electrode, applying a second non-volatile state potential to each front or back gate electrode, and applying a third non-volatile state potential to the front or back gate of the $i^{th}$ memory cell to which the second non-volatile state potential is applied, the second non-volatile state potential being higher than the first non-volatile state potential, and the third non-volatile state potential being higher than the second non-volatile state potential.

9. A semiconductor memory device of claim 8, wherein the set of n memory cells includes at least two sets of n memory cells, corresponding cells in the at least two sets of n memory cells are connected in parallel, and the information is written by applying the respective potentials to the first electrode and the front and back gate electrodes corresponding to the $i^{th}$ memory cell.

10. A semiconductor memory device that stores information in volatile and non-volatile states, comprising:

a semiconductor layer:

first and second electrodes provided on respective ends of the semiconductor layer;

a set of n memory cells included in the semiconductor layer and being connected in series between first and second electrodes, where n is a positive integer equal to or greater than two;

front and back gate electrodes provided respectively on sides of each of the n memory cells, wherein the information is written in an $i^{th}$ memory cell by applying a first non-volatile state potential to the first electrode, applying a second non-volatile state potential to each front or back gate electrode, and applying a third non-volatile state potential to the front or back gate of the $i^{th}$ memory cell to which the second non-volatile state potential is applied, the second non-volatile state potential being higher than the first non-volatile state potential, and the third non-volatile state potential being higher than the second non-volatile state potential, where the "i" is a positive integer, and identifies a specific memory cell on which the information is written.

* * * * *